(12) United States Patent
Ikeuchi

(10) Patent No.: US 9,379,049 B2
(45) Date of Patent: Jun. 28, 2016

(54) SEMICONDUCTOR APPARATUS

(71) Applicant: Panasonic Intellectual Property Management Co., Ltd., Osaka (JP)

(72) Inventor: Hiroki Ikeuchi, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 14/409,135

(22) PCT Filed: May 27, 2013

(86) PCT No.: PCT/JP2013/003338
§ 371 (c)(1),
(2) Date: Dec. 18, 2014

(87) PCT Pub. No.: WO2014/006814
PCT Pub. Date: Jan. 9, 2014

(65) Prior Publication Data
US 2015/0194372 A1    Jul. 9, 2015

(30) Foreign Application Priority Data

Jul. 4, 2012 (JP) ................................. 2012-150738

(51) Int. Cl.
*H01L 23/495* (2006.01)
*H01L 23/433* (2006.01)
(Continued)

(52) U.S. Cl.
CPC ...... *H01L 23/49568* (2013.01); *H01L 23/4334* (2013.01); *H01L 23/4952* (2013.01); *H01L 23/49524* (2013.01); *H01L 23/49537* (2013.01); *H01L 23/49562* (2013.01); *H01L 23/49575* (2013.01); *H01L 23/645* (2013.01); *H01L 24/37* (2013.01); *H01L 24/40* (2013.01);
(Continued)

(58) Field of Classification Search
CPC ............... H01L 23/49568; H01L 23/4952; H01L 23/49537; H01L 23/645; H01L 23/4334; H01L 23/49562; H01L 23/49575; H01L 23/49524; H01L 2924/181; H01L 2924/00011
See application file for complete search history.

(56) References Cited

U.S. PATENT DOCUMENTS 5,734,198 A * 3/1998 Stave ............................ 257/666
5,864,173 A   1/1999 Fogelson
(Continued)

FOREIGN PATENT DOCUMENTS

JP       06252332      9/1994
JP     2004221552      8/2004
(Continued)

OTHER PUBLICATIONS

International Search Report for International Application No. PCT/JP2013/003338 mailed Aug. 13, 2013.
(Continued)

*Primary Examiner* — Su C Kim
(74) *Attorney, Agent, or Firm* — RatnerPrestia

(57) ABSTRACT

The semiconductor apparatus includes: the first lead frame; the second lead frame; the second insulation resin which is disposed between the first lead frame and the second lead frame; the sealing resin which seals the semiconductor elements, the first lead frame and the second lead frame; the electric wiring part which electrically connects the semiconductor elements and the first lead frame; and the interlayer connecting part which electrically connects the first lead frame and the second lead frame.

6 Claims, 11 Drawing Sheets

(51) Int. Cl.
*H01L 23/64* (2006.01)
*H02M 7/00* (2006.01)
*H01L 23/373* (2006.01)
*H01L 25/07* (2006.01)
*H01L 23/31* (2006.01)
*H01L 23/00* (2006.01)
*H01L 25/18* (2006.01)

(52) U.S. Cl.
CPC ......... *H01L23/3121* (2013.01); *H01L 23/3735* (2013.01); *H01L 24/29* (2013.01); *H01L 24/32* (2013.01); *H01L 24/45* (2013.01); *H01L 24/48* (2013.01); *H01L 24/73* (2013.01); *H01L 24/83* (2013.01); *H01L 24/84* (2013.01); *H01L 24/92* (2013.01); *H01L 25/072* (2013.01); *H01L 25/18* (2013.01); *H01L 2224/2919* (2013.01); *H01L 2224/29111* (2013.01); *H01L 2224/29118* (2013.01); *H01L 2224/29139* (2013.01); *H01L 2224/29144* (2013.01); *H01L 2224/29191* (2013.01); *H01L 2224/32245* (2013.01); *H01L 2224/3701* (2013.01); *H01L 2224/37011* (2013.01); *H01L 2224/40095* (2013.01); *H01L 2224/40139* (2013.01); *H01L 2224/40247* (2013.01); *H01L 2224/45124* (2013.01); *H01L 2224/45144* (2013.01); *H01L 2224/45147* (2013.01); *H01L 2224/48247* (2013.01); *H01L 2224/73221* (2013.01); *H01L 2224/73263* (2013.01); *H01L 2224/73265* (2013.01); *H01L 2224/8382* (2013.01); *H01L 2224/83801* (2013.01); *H01L 2224/83851* (2013.01); *H01L 2224/8482* (2013.01); *H01L 2224/84205* (2013.01); *H01L 2224/84801* (2013.01); *H01L 2224/92247* (2013.01); *H01L 2224/92248* (2013.01); *H01L 2924/00011* (2013.01); *H01L 2924/1033* (2013.01); *H01L 2924/10253* (2013.01); *H01L 2924/10272* (2013.01); *H01L 2924/10329* (2013.01); *H01L 2924/1305* (2013.01); *H01L 2924/13055* (2013.01); *H01L 2924/15787* (2013.01); *H01L 2924/181* (2013.01); *H01L 2924/19107* (2013.01); *H01L 2924/30107* (2013.01); *H02M 7/003* (2013.01)

(56) References Cited

U.S. PATENT DOCUMENTS

| | | | |
|---|---|---|---|
| 6,373,705 B1 * | 4/2002 | Koelle et al. | ........... 361/720 |
| 2005/0087849 A1 | 4/2005 | Morita | |
| 2012/0038033 A1 | 2/2012 | Oga | |

FOREIGN PATENT DOCUMENTS

| | | |
|---|---|---|
| JP | 2005236108 | 9/2005 |
| JP | 4277169 | 6/2009 |
| JP | 2010258485 | 11/2010 |

OTHER PUBLICATIONS

European Search Report mailed Nov. 16, 2015 for European Application No. 13813359.0.

* cited by examiner

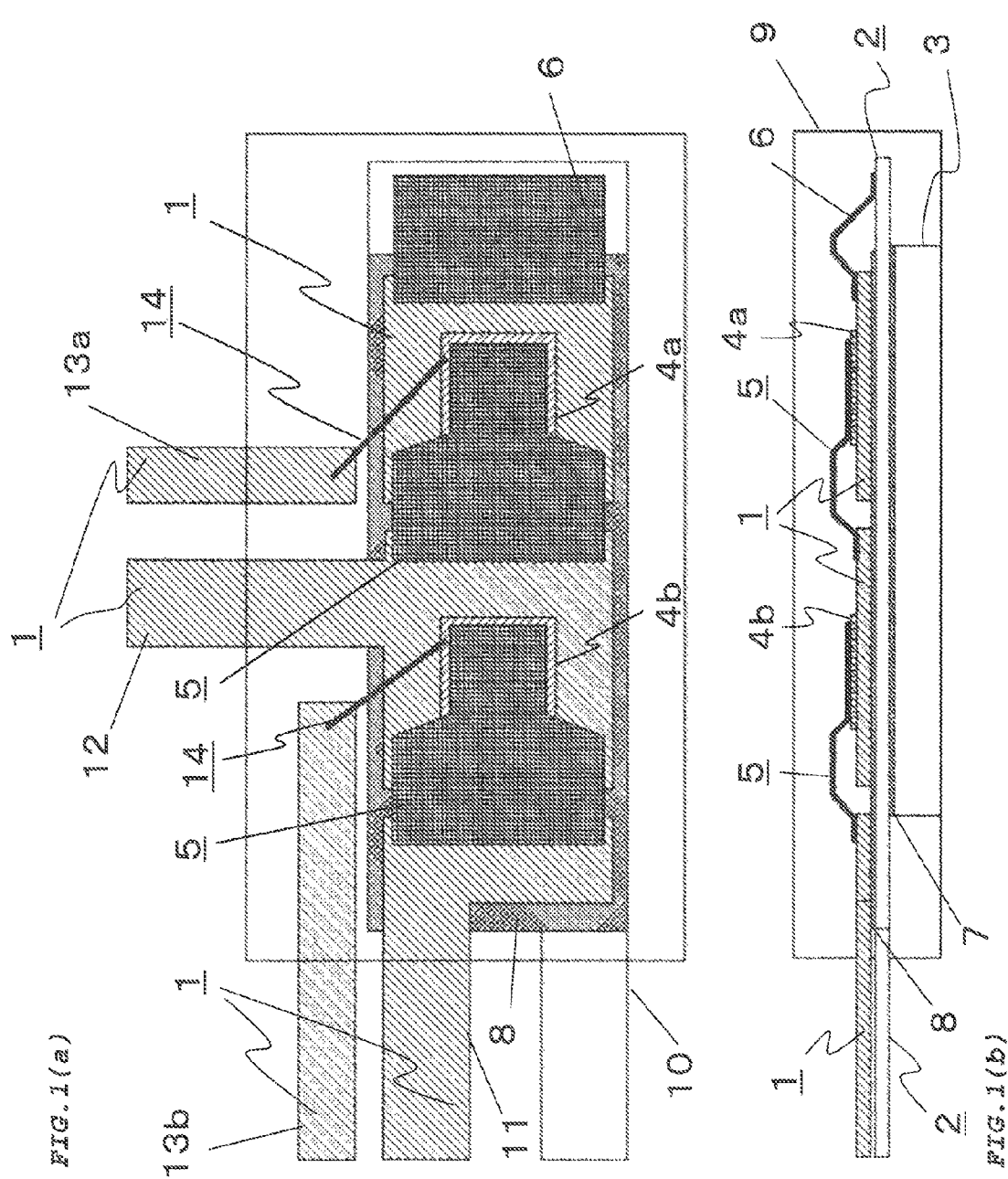

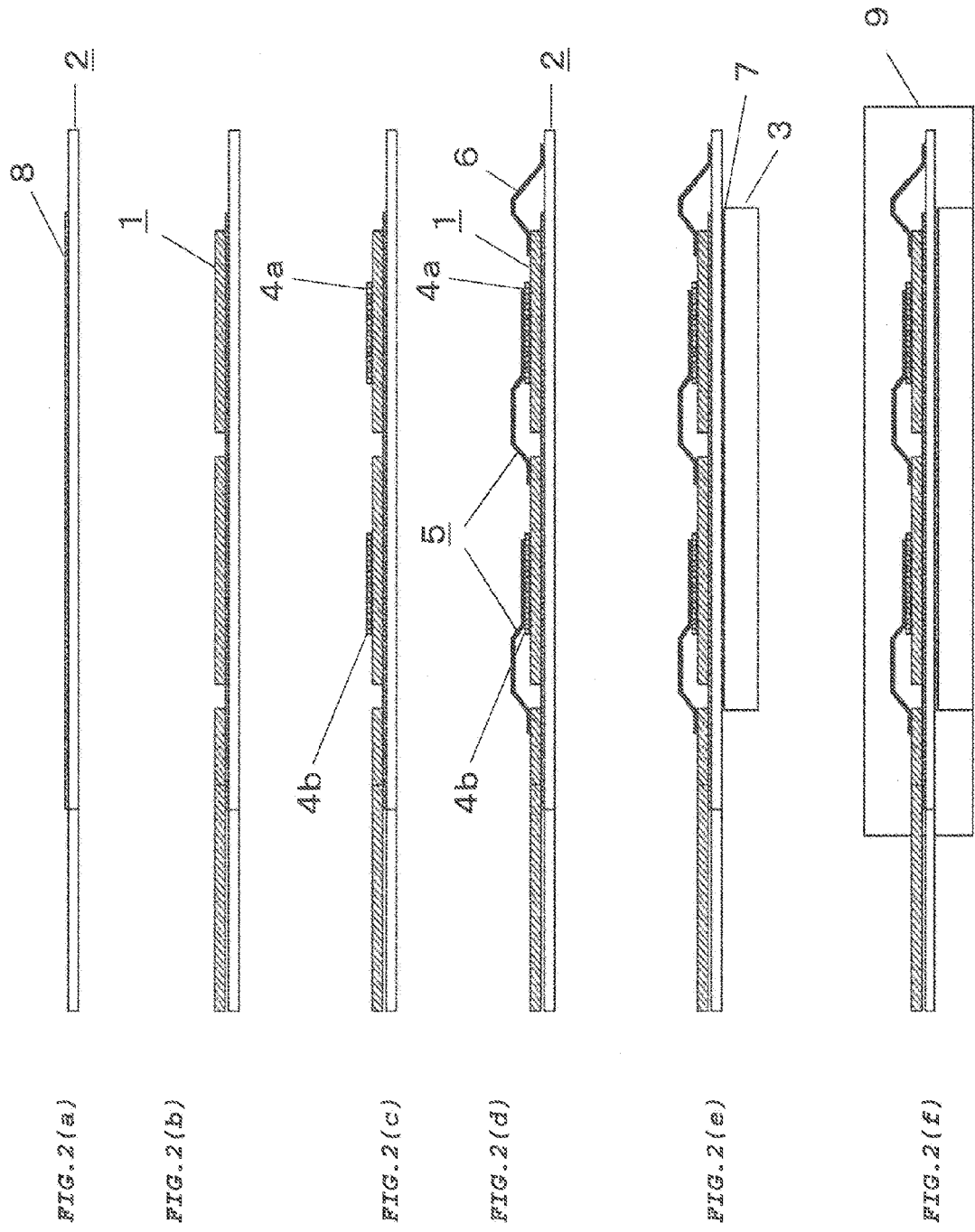

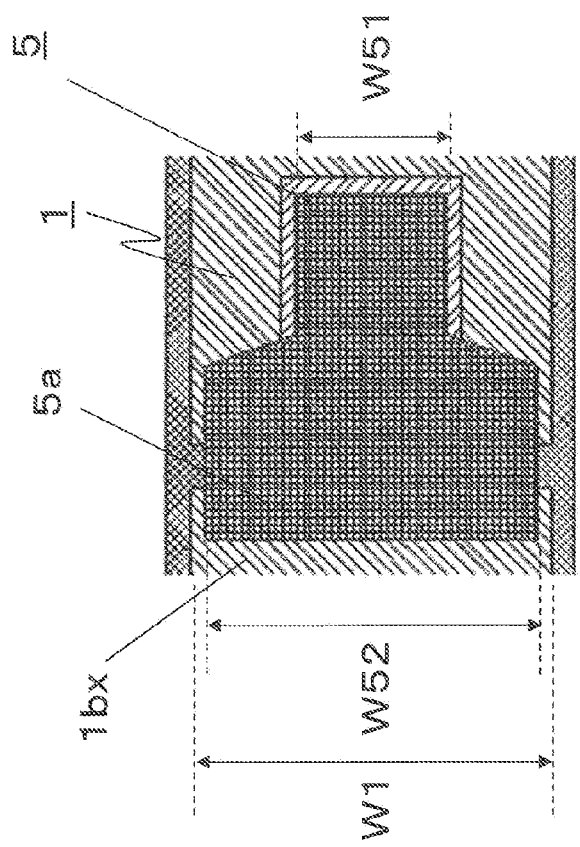
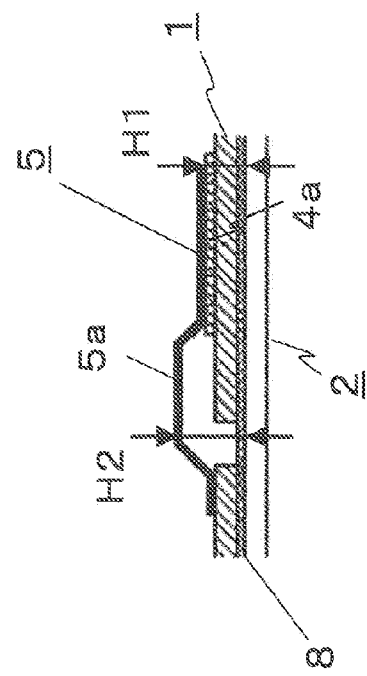
FIG.3(a)
FIG.3(b)

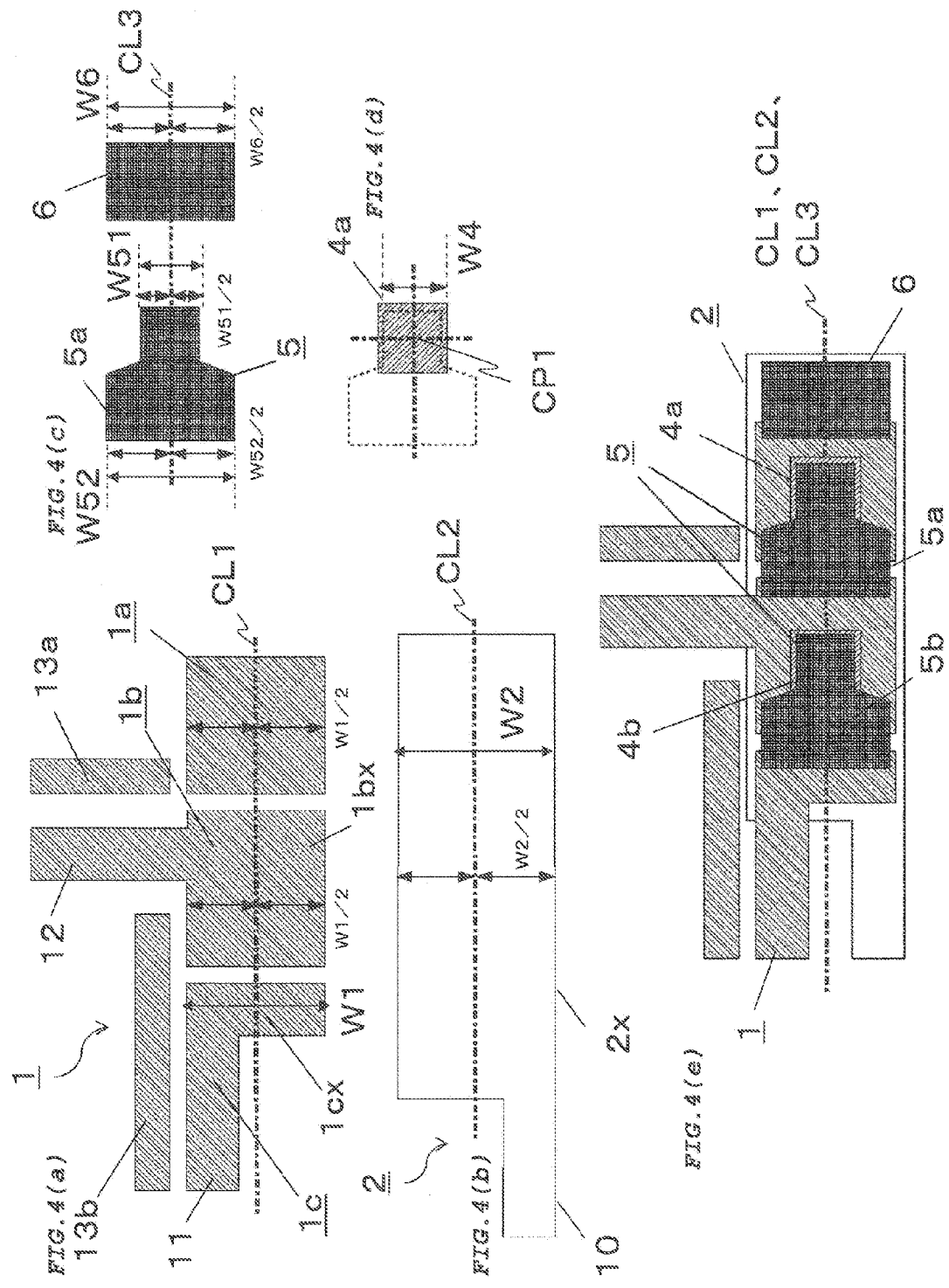

SEMICONDUCTOR APPARATUS

CROSS-REFERENCE TO RELATED APPLICATIONS

This application is a U.S. national phase application of PCT International Patent Application No. PCT/JP2013/003338 filed May 27, 2013, claiming the benefit of priority of Japanese Patent Application No. 2012-150738 filed Jul. 4, 2012, all of which are incorporated by reference herein in their entirety.

TECHNICAL FIELD

The present invention relates to, for example, a semiconductor apparatus which is utilized for an electric power converting apparatus such as an inverter or the like.

BACKGROUND ART

To begin with, while mainly referring to FIGS. 7-10, descriptions are given regarding the configuration of a conventional inverter.

Additionally, FIG. 7 is a schematic main circuit diagram of a conventional inverter.

Moreover, FIG. 8 is a schematic external-appearance view of a conventional inverter module with two elements inside.

Moreover, FIG. 9 is a schematic section view of a conventional inverter module with two elements inside.

Moreover, FIG. 10 is a schematic inner part equivalency-circuit diagram of a conventional inverter module with two elements inside.

The inverter which is shown in FIG. 7 comprises an alternate current electric source 101 for commercial use, a diode rectifier module 102 which converts an alternate current to a direct current, a condenser 103 of large capacity, a load 104 such as a 3-phase motor or the like which has the U phase, V phase and W phase electrodes, and an inverter module 105 which possesses semiconductor elements for electric power such as IGBT (Insulated Gate Bipolar Transistor) chips 106, FWD (Free Wheel Diode) chips 107 and the like and converts a direct current to an alternate current.

The FWD chip 107 is connected with the IGBT chip 106 in reverse-parallel, and the inverter module 105 is configured with these of 6 arms (6 circuits).

Usually, for the inverter module 105, either two elements of the upper and lower arms are allowed to constitute one group, or six elements are allowed to constitute one group.

Hence, in a case where the inverter is configured, either three inverter modules with two elements inside are connected in parallel and made use of, or an inverter module with six elements inside is made use of as it is.

The inverter module with two elements inside which is shown in FIG. 8 comprises a P output electrode (a positive side electric-source-electric-potential output electrode) 108 of direct current and an N output electrode (a negative side electric-source-electric-potential output electrode) 109, a U output electrode 110 which is connected to the load side, and gate terminals 111 and 113 of the IGBT chips of the upper and lower arms and emitter terminals 112 and 114.

And, the inverter module with two elements inside which is shown in FIG. 9 comprises a copper base substrate 115, a ceramic substrate 116 for insulation, copper patterns 117, 118 and 119 for wiring and semiconductor chip connecting, IGBT chips 120 and 121 of the upper and lower arms, electrodes 122 and 123 for connecting the IGBT chips 120 and 121 and the copper patterns 118 and 119 respectively, and copper electrode bars 124, 125 and 126 for connecting the copper patterns 117, 118 and 119 and the P, U and N output electrodes respectively.

Additionally, it is similarly equipped also with FWD chips (not shown in the figures) as well as the IGBT chips 120 and 121.

As shown in FIG. 10, an inductor 127 gives the inductance L1 between the collector terminal of the upper arm and the P output electrode, an inductor 128 gives the inductance L2 between the emitter terminal of the upper arm and a connecting point 129, namely between the copper pattern 118 (refer to FIG. 9) and the copper electrode bar 125 (refer to FIG. 9), an inductor 130 gives the inductance L3 between the connecting point 129 and the collector terminal of the lower arm, and an inductor 131 gives the inductance L4 between the emitter terminal of the lower arm and the N output electrode.

Next, while mainly referring to FIG. 11, descriptions are given regarding the action of a conventional inverter.

Additionally, FIG. 11 is a schematic waveform chart of turn-off waveform of the IGBT of a conventional inverter module.

Usually, in the circuit of an inverter such as the above-mentioned, the operation thereof is performed with the IGBT allowed to be switched roughly at 10 kHz.

Represented as in the next equation is the peak electric voltage $V_{CE(peak)}$ (hereinafter simply the electric voltage $V_{CE}$) which is applied between the collector terminal of the IGBT chip and the emitter terminal at the time when the IGBT is turned off.

$$V_{CE}=Ed+(L1+L2+L3+L4)\cdot di/dt \quad \text{(Equation 1)}$$

Here, Ed is the direct current electric voltage of the condenser 103 (refer to FIG. 7), and di/dt is the magnitude of the changing rate (<0) of the electric current $I_C$ of the IGBT chip.

As shown in FIG. 11, the waveforms of the electric voltage $V_{CE}$ and the electric current $I_C$ of the IGBT chip largely change at the time when the IGBT is turned off.

Namely, the surge electric voltage $\Delta V(=V_{CE}-Ed)$ which is the changing from the direct current electric voltage Ed is determined by the values of L1 through L4 and di/dt and, as is apparent from (Equation 1), if the values of L1 through L4 are large, then the electric voltage $V_{CE}$ becomes high which is applied at the time when the IGBT is turned off.

Because of this, chips whose electric voltage resistance-quantities are high often become necessary as the IGBT chip and the FWD chip that is connected in reverse-parallel, which is apt to lead to enlargement of the inverter module and cost increase, since a chip like that usually has a broad chip area.

Further, if the surge electric voltage is high, then the noise that is brought to the outer part is large, which is apt to lead to malfunction of an external instrument.

Now, if the copper electrode bars like the above-mentioned are allowed to come in close proximity to each other, then a phenomenon such that inductance components are made to cancel out by mutual inductance is generated.

Thereupon, known is an art such that the copper electrode bars, which are connected to the P, U and N output electrodes of the inverter module respectively, are allowed to come in close proximity to each other and are disposed above the upper faces of the chips so as to lower unnecessary inductance components by mutual inductance (for example, refer to Specification of Japanese Patent No. 4277169).

SUMMARY OF THE INVENTION

Problems to be Solved by the Invention

However, a conventional configuration such that the copper electrode bars are allowed to come in close proximity to each other and are disposed above the upper faces of the chips like the above-mentioned has been, since the copper electrode bars are disposed while avoiding the chips, insufficient for the object of lowering unnecessary inductance components.

Particularly, since in recent years an inverter or the like which utilizes SiC, GaN, GaAs or the like and has high speed switching performance has been appearing, with the said configuration it is difficult to sufficiently lower unnecessary inductance components, and the performance thereof is sometimes unable to be sufficiently exerted.

Thereupon, the present invention furnishes, considering the conventional problems which have been mentioned above, a semiconductor apparatus capable of more lowering unnecessary inductance components.

Means for Solving the Problem

The 1$^{st}$ aspect of the present invention is a semiconductor apparatus, comprising:
  a first lead frame which is equipped with first and second semiconductor elements;
  a second lead frame which is disposed in parallel with the first lead frame;
  a second insulation resin which is disposed between the first lead frame and the second lead frame;
  a sealing resin which seals the first and second semiconductor elements, the first lead frame and the second lead frame;
  an electric wiring part which electrically connects with the first and second semiconductor elements the first lead frame; and
  an interlayer connecting part which electrically connects the first lead frame and the second lead frame.

The 2$^{nd}$ aspect of the present invention is a semiconductor apparatus according to the 1$^{st}$ aspect of the present invention, comprising:
  a heat radiating plate which is disposed in parallel with the second lead frame; and
  a first insulation resin which is disposed between the second lead frame and the heat radiating plate, wherein
  the sealing resin seals the heat radiating plate,
  the first lead frame has: a first island-shaped part which is equipped with the first semiconductor element; a second island-shaped part which has an output electrode, and is equipped with the second semiconductor element; and a third island-shaped part which has one of a positive-electrode side outer part electrode and a negative-electrode side outer part electrode,
  the second lead frame has another of the positive-electrode side outer part electrode and the negative-electrode side outer part electrode,
  the electric wiring part electrically connects the first semiconductor element and the second island-shaped part, and electrically connects the second semiconductor element and the third island-shaped part, and
  the interlayer connecting part electrically connects the first island-shaped part and the second lead frame.

The 3$^{rd}$ aspect of the present invention is a semiconductor apparatus according to the 1$^{st}$ aspect of the present invention, wherein
  a distance between the first lead frame and the second lead frame is equal to or more than 50 μm and equal to or less than 500 μm.

The 4$^{th}$ aspect of the present invention is a semiconductor apparatus according to the 2$^{nd}$ aspect of the present invention, wherein
  the first island-shaped part has a shape of a rectangle,
  a main body part of the second island-shaped part, except for the output electrode, has a shape of a rectangle,
  a main body part of the third island-shaped part, except for the one of the positive-electrode side outer part electrode and the negative-electrode side outer part electrode, has a shape of a rectangle,
  a main body part of the second lead frame, except for the another of the positive-electrode side outer part electrode and the negative-electrode side outer part electrode, has a shape of a rectangle,
  a center line of the first island-shaped part, a center line of the main body part of the second island-shaped part, a center line of the main body part of the third island-shaped part, a center line of the main body part of the second lead frame, a center line of the electric wiring part and a center line of the interlayer connecting part are disposed on a same line, and
  center points of the first and second semiconductor elements are disposed on the same line.

The 5$^{th}$ aspect of the present invention is a semiconductor apparatus according to the 2$^{nd}$ aspect of the present invention, wherein
  the electric wiring part has a shape of a flat plate being bent,
  a main body part of the second island-shaped part, except for the output electrode, has a shape of a rectangle,
  a main body part of the third island-shaped part, except for the one of the positive-electrode side outer part electrode and the negative-electrode side outer part electrode, has a shape of a rectangle, and
  equal are a width of the main body part of the second island-shaped part in a direction orthogonal to an electric current direction, a width of the main body part of the third island-shaped part in a direction orthogonal to an electric current direction, and a width of a portion of the electric wiring part, which is electrically connected with the second and third island-shaped parts, in a direction orthogonal to an electric current direction.

The 6$^{th}$ aspect of the present invention is a semiconductor apparatus according to the 2$^{nd}$ aspect of the present invention, wherein
  the interlayer connecting part has a shape of a flat plate being bent,
  the first island-shaped part has a shape of a rectangle, and
  equal are a width of the first island-shaped part in a direction orthogonal to an electric current direction, and a width of a portion of the interlayer connecting part, which is electrically connected with the first island-shaped part, in a direction orthogonal to an electric current direction.

The 7$^{th}$ aspect of the present invention is a semiconductor apparatus according to the 2$^{nd}$ aspect of the present invention, being a semiconductor apparatus which is utilized for an electric power converting apparatus for a 3-phase motor, wherein
  the output electrode is an electrode which is connected to one of U phase, V phase and W phase electrodes of the 3-phase motor.

Effects of the Invention

By the present invention, a semiconductor apparatus capable of more lowering unnecessary inductance components can be furnished.

BRIEF DESCRIPTION OF THE DRAWINGS

FIG. 1(a) is a schematic top view of the semiconductor apparatus of Embodiment 1 in the present invention; and FIG. 1(b) is a schematic section view of the semiconductor apparatus of Embodiment 1 in the present invention.

FIG. 2(a) is a schematic section view which describes the first step of the manufacturing method of the semiconductor apparatus of Embodiment 1 in the present invention; FIG. 2(b) is a schematic section view which describes the second step of the manufacturing method of the semiconductor apparatus of Embodiment 1 in the present invention; FIG. 2(c) is a schematic section view which describes the third step of the manufacturing method of the semiconductor apparatus of Embodiment 1 in the present invention; FIG. 2(d) is a schematic section view which describes the fourth step of the manufacturing method of the semiconductor apparatus of Embodiment 1 in the present invention; FIG. 2(e) is a schematic section view which describes the fifth step of the manufacturing method of the semiconductor apparatus of Embodiment 1 in the present invention; and FIG. 2(f) is a schematic section view which describes the sixth step of the manufacturing method of the semiconductor apparatus of Embodiment 1 in the present invention.

FIG. 3(a) is a schematic portion-expansion top view of the electric wiring part of Embodiment 1 in the present invention; and FIG. 3(b) is a schematic portion-expansion section view of the electric wiring part of Embodiment 1 in the present invention.

FIG. 4(a) is a schematic top view of the first lead frame before assembling of Embodiment 1 in the present invention; FIG. 4(b) is a schematic top view of the second lead frame before assembling of Embodiment 1 in the present invention; FIG. 4(c) is a schematic top view of the electric wiring part and the interlayer connecting part before assembling of Embodiment 1 in the present invention; FIG. 4(d) is a schematic top view of the semiconductor element before assembling of Embodiment 1 in the present invention; and FIG. 4(e) is a schematic top view of the first lead frame, the second lead frame, the electric wiring part and the interlayer connecting part, and the semiconductor elements after assembling of Embodiment 1 in the present invention.

MODES FOR IMPLEMENTING THE INVENTION

Figure 5:
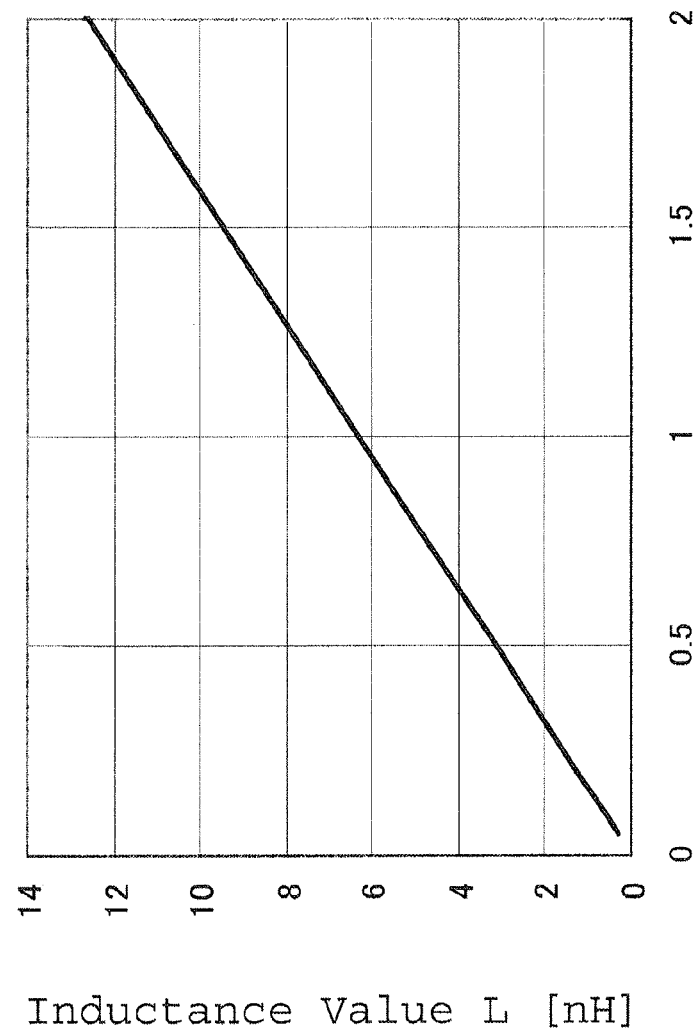
FIG. 5 is a description chart of the inductance values in a case where the distance between the first lead frame and the second lead frame of the semiconductor apparatus of Embodiment 1 in the present invention has been allowed to change.

In the following, while referring to the drawings, descriptions are given in detail regarding embodiments of the present invention.

Embodiment 1

To begin with, while referring to FIGS. 1-5, descriptions are given regarding the configuration and action of the semiconductor apparatus of Embodiment 1.

Additionally, FIG. 1(a) is a schematic top view of the semiconductor apparatus of Embodiment 1 in the present invention, and FIG. 1(b) is a schematic section view of the semiconductor apparatus of Embodiment 1 in the present invention.

Moreover, FIGS. 2(a)-(f) are schematic section views which describe the first to sixth steps of the manufacturing method of the semiconductor apparatus of Embodiment 1 in the present invention.

Moreover, FIG. 3(a) is a schematic portion-expansion top view of the electric wiring part 5 of Embodiment 1 in the present invention, and FIG. 3(b) is a schematic portion-expansion section view of the electric wiring part 5 of Embodiment 1 in the present invention.

Moreover, FIG. 4(a) is a schematic top view of the first lead frame 1 before assembling of Embodiment 1 in the present invention, FIG. 4(b) is a schematic top view of the second lead frame 2 before assembling of Embodiment 1 in the present invention, FIG. 4(c) is a schematic top view of the electric wiring part 5 and the interlayer connecting part 6 before assembling of Embodiment 1 in the present invention, FIG. 4(d) is a schematic top view of the semiconductor element 4a before assembling of Embodiment 1 in the present invention, and FIG. 4(e) is a schematic top view of the first lead frame 1, the second lead frame 2, the electric wiring part 5 and the interlayer connecting part 6, and the semiconductor elements 4a and 4b after assembling of Embodiment 1 in the present invention.

Moreover, FIG. 5 is a description chart of the inductance values L in a case where the distance Th between the first lead frame 1 and the second lead frame 2 of the semiconductor apparatus of Embodiment 1 in the present invention has been allowed to change.

To begin with, while mainly referring to FIGS. 1(a) and (b), descriptions are given regarding the configuration of the semiconductor apparatus of the present embodiment.

The semiconductor apparatus of the present embodiment comprises the first lead frame 1 and the second lead frame 2, and possesses two layer structure with respect to the lead frames.

The electric wiring part 5 and the controlling electrode wiring part 14 electrically connect the semiconductor elements 4a and 4b and the first lead frame 1.

The interlayer connecting part 6 electrically connects the first lead frame 1 and the second lead frame 2.

The first lead frame 1 is equipped with the semiconductor elements 4a and 4b, also has the negative-electrode side outer part electrode 11, the output electrode 12, the positive-electrode side controlling electrode 13a and the negative-electrode side controlling electrode 13b, and allows an electrode like this to be exposed to the outer part.

The second lead frame 2 has the positive-electrode side outer part electrode 10, and allows an electrode like this to be exposed to the outer part.

The heat radiating plate 3 is disposed in parallel with the second lead frame 2 at a proximity position.

And, the first insulation resin 7 is disposed between the heat radiating plate 3 and the second lead frame 2, and the heat radiating plate 3 and the second lead frame 2 are electrically insulated and are also structurally fixed.

The sealing resin 9 wholly seals the semiconductor apparatus in a state where a part of the heat radiating plate 3 is exposed.

The first lead frame 1 is disposed in parallel with the second lead frame 2 at a proximity position.

And, the second insulation resin 8 is disposed between the first lead frame 1 and the second lead frame 2, and the first lead frame 1 and the second lead frame 2 are electrically insulated and are also structurally fixed.

At this point, the distance (the maximum distance) Th between the first lead frame 1 and the second lead frame 2, which is exemplified as the distance H1, the distance (the maximum distance) H2 or the like which are mentioned later, is allowed to be equal to or less than 500 [μm] and be equal to or more than 50 [μm].

The reason thereof is next described as follows.

Namely, the inductance value after inductance components having been made to cancel out by mutual inductance can be readily obtained with the following equation.

$$L = 1.26 \cdot (Th/W) \cdot D \; [\text{nH}] \quad \text{(Equation 2)}$$

Here, L is the inductance value [nH], Th is as mentioned above the distance [mm] between the first lead frame 1 and the second lead frame 2, W is the width [mm] of the first lead frame 1, and D is the length [mm] of the first lead frame 1.

In a case where W=10 [mm] and D=50 [mm] with a semiconductor apparatus of output equal to or less than 10 kW being assumed, the calculation results regarding Th=0.05-2 [mm] are shown in FIG. 5.

Regarding the inductance value L, it is necessary that the electric voltage $V_{CE}$ (refer to (Equation 1)) with the surge electric voltage $\Delta V$ which is generated on the occasion when the semiconductor apparatus acts also being considered be such a value as does not exceed the resistance electric voltage of the semiconductor elements 4a and 4b.

For example, if the resistance electric voltage of the semiconductor elements 4a and 4b is assumed to be 600[V] which is a general value, and the safety rate which is defined as (the load being a minimum for which the system is broken down for example)/(the load being a maximum for which the system can be safely utilized) is considered, then design such that the electric voltage $V_{CE}$ does not exceed 480[V] is necessary.

Figure 7:
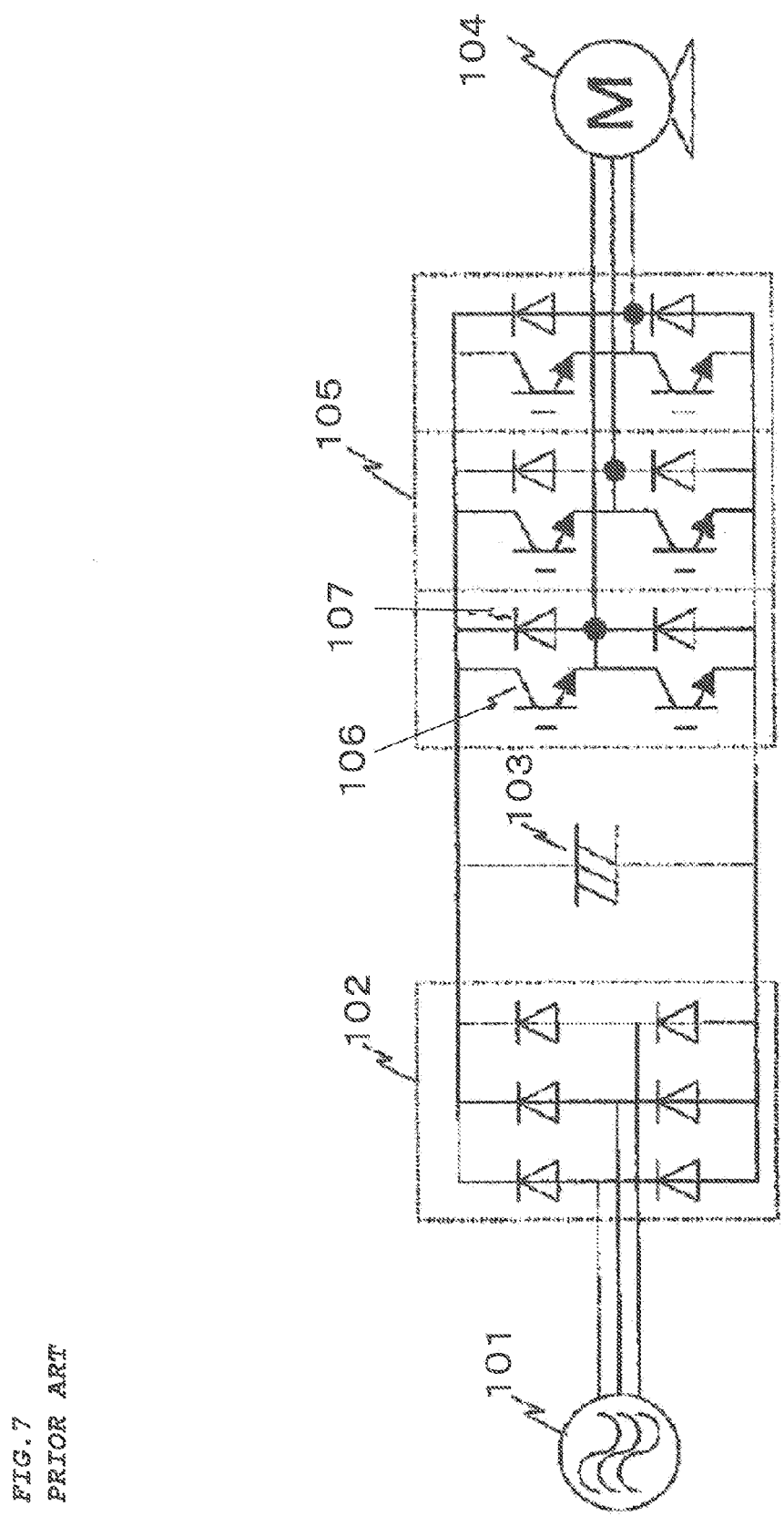
FIG. 7 is a schematic main circuit diagram of a conventional inverter.
Figure 8:
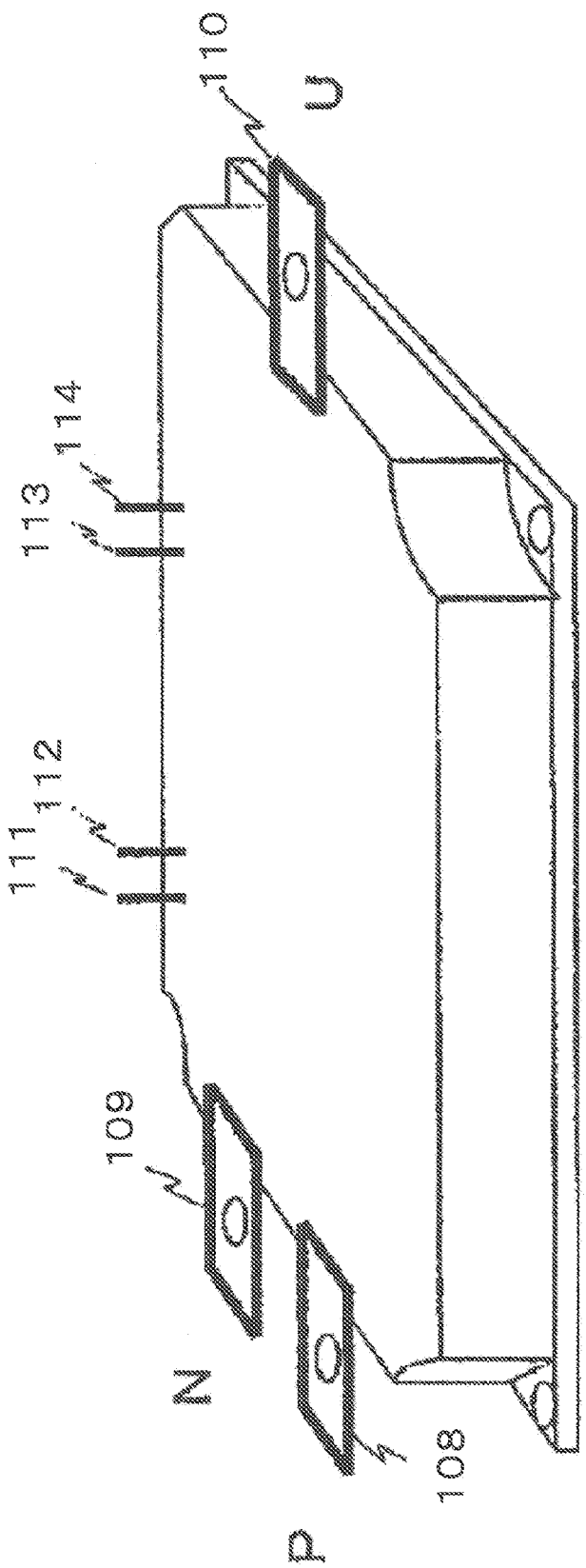
FIG. 8 is a schematic external-appearance view of a conventional inverter module with two elements inside.
Figure 9:
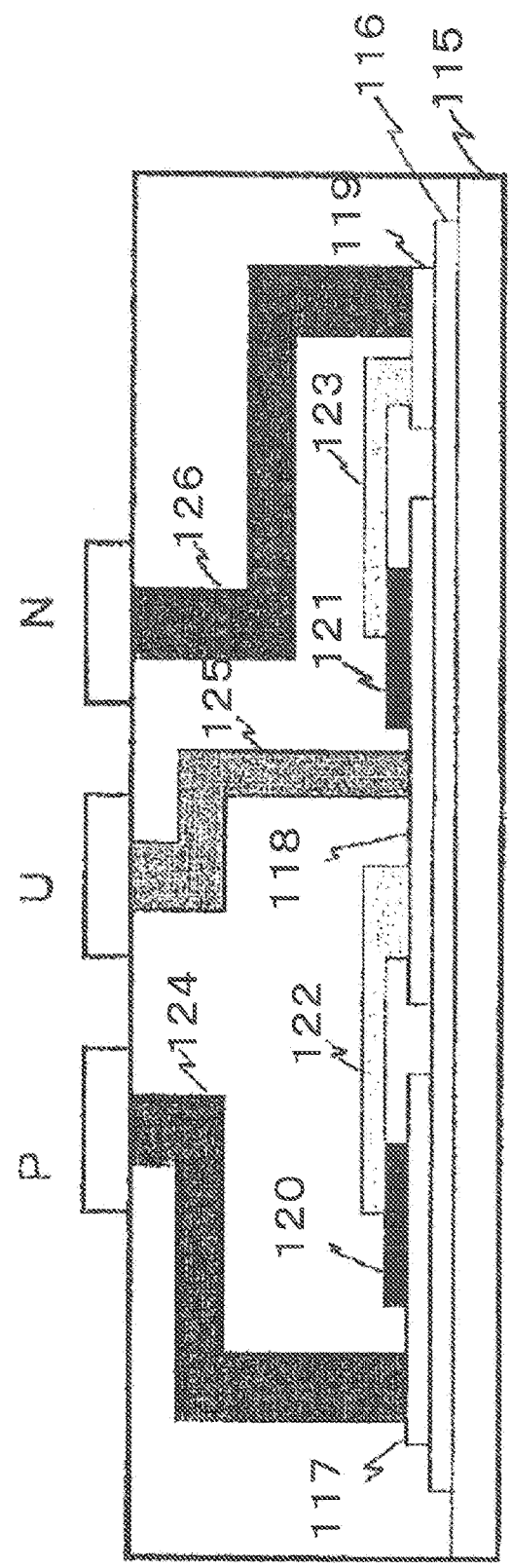
FIG. 9 is a schematic section view of a conventional inverter module with two elements inside.
Figure 10:
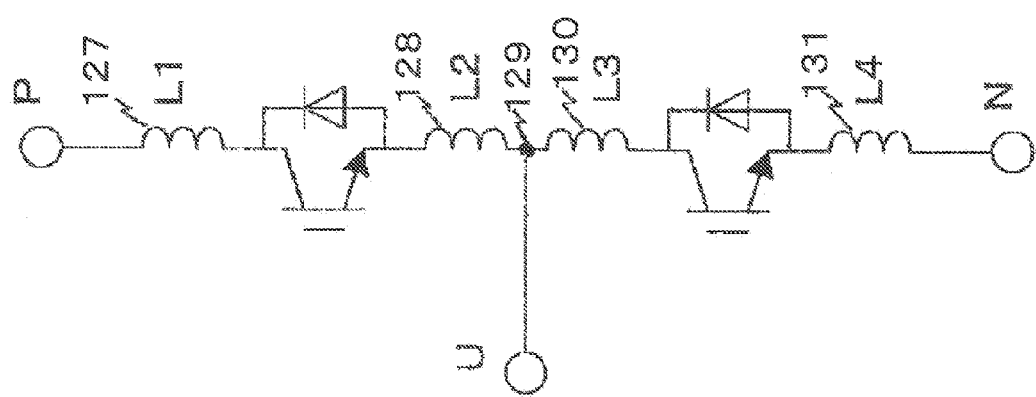
FIG. 10 is a schematic inner part equivalency-circuit diagram of a conventional inverter module with two elements inside.
Figure 11:
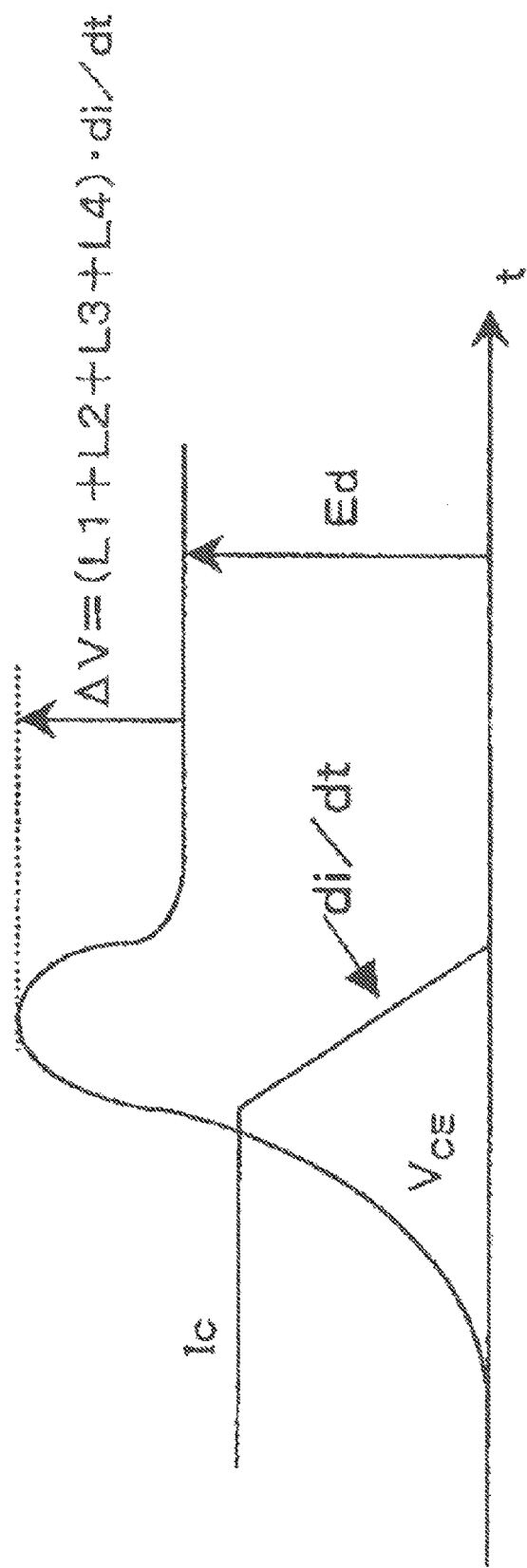
FIG. 11 is a schematic waveform chart of turn-off waveform of the IGBT of a conventional inverter module.

In the above-stated case, where the resistance electric voltage of the semiconductor elements 4a and 4b is 600[V], because the direct current electric voltage Ed of the condenser 103 (refer to FIG. 7) is assumed to amount roughly to 450[V], the surge electric voltage $\Delta V$ which is permitted is roughly 30[V](=480[V]−450[V]).

At this point, it must be assumed that the magnitude of the electric current changing rate di/dt of the semiconductor elements 4a and 4b at the time of turn-off is in general roughly 1 [A/ns] in an Si device such as an IGBT or the like, but is roughly 10 [A/ns], which is larger, in a high speed device which utilizes SiC, GaN or the like.

In case, for example, di/dt is roughly 10 [A/ns], and the inductance value L is roughly 10 [nH], then the surge electric voltage $\Delta V$ is roughly 100[V](=10 [nH]×10 [A/ns]), and there is fear that the semiconductor elements 4a and 4b break down.

Thereupon, provided that the distance Th is allowed to be equal to or less than 500 [μm](=0.5 [mm]), since the inductance value L becomes equal to or less than 3 [nH] as shown in FIG. 5, then the surge electric voltage $\Delta V$ becomes equal to or less than 30[V](=3 [nH]×10[A/ns]).

Hence, the distance Th between the first lead frame 1 and the second lead frame 2 is allowed to be equal to or less than 500 [μm].

Further, in a semiconductor apparatus for electric power, it is necessary to ensure an insulation property at a high electric voltage equal to or more than 1500[V] for example.

Thereupon, the distance Th between the first lead frame 1 and the second lead frame 2 is allowed to be equal to or more than 50 [μm].

The reason thereof is that, in case the distance Th is less than 50 [μm], then it becomes difficult to prevent an insulation breakdown due to minute defects which exist in the second insulation resin 8, and/or convexoconcaves which are minute and exist on the surfaces of the first lead frame 1 and the second lead frame 2.

Of course, various numerical values are specific examples, which is similarly true also in the following.

Next, while mainly referring to FIGS. 4(a)-(e), specific descriptions are given regarding the shapes of the first lead frame 1, the second lead frame 2, the electric wiring part 5 and the interlayer connecting part 6, and the semiconductor elements 4a and 4b, and specific descriptions are given also regarding the position relationship of these.

The first lead frame 1 has such a shape as is shown in FIG. 4(a).

The first lead frame 1 has the first island-shaped part 1a, the second island-shaped part 1b and the third island-shaped part 1c. The first island-shaped part 1a is equipped with the semiconductor element 4a. The second island-shaped part 1b has the output electrode 12, and is equipped with the semiconductor element 4b. The third island-shaped part 1c has the negative-electrode side outer part electrode 11.

The first island-shaped part 1a is a shape of a rectangle.

The main body part 1bx of the second island-shaped part 1b, except for the output electrode 12, is a shape of a rectangle.

The main body part 1cx of the third island-shaped part 1c, except for the negative-electrode side outer part electrode 11, is a shape of a rectangle.

The dot-dash-line shows the center line CL1 of the first island-shaped part 1a, the main body part 1bx and the main body part 1cx, and the direction thereof is the same as the direction in which the electric current that has gone in from the first island-shaped part 1a flows.

The width W1 of the first island-shaped part 1a, and the main body parts 1bx and 1cx shows a width in the direction orthogonal to the center line CL1.

The second lead frame 2 has such a shape as is shown in FIG. 4(b).

The main body part 2x of the second lead frame 2, except for the positive-electrode side outer part electrode 10, is a shape of a rectangle.

The dot-dash-line shows the center line CL2 of the main body part 2x, and the direction thereof is the same as the direction in which the electric current that has gone in from the positive-electrode side outer part electrode 10 flows.

The main body part 2x is a portion to which the first lead frame 1 comes in close proximity via the second insulation resin 8 as an insulation layer.

The width W2 of the main body part 2x shows a width in the direction orthogonal to the center line CL2.

The electric wiring part 5 and the interlayer connecting part 6 have such shapes as are shown in FIG. 4(c).

The electric wiring part 5 has the portions 5a and 5b. The portion 5a electrically connects the semiconductor element 4a and the second island-shaped part 1b. The portion 5b electrically connects the semiconductor element 4b and the third island-shaped part 1c.

The interlayer connecting part 6 electrically connects the first island-shaped part 1a and the second lead frame 2.

The dot-dash-line shows the center line CL3 of the electric wiring part 5 and the interlayer connecting part 6, and the direction thereof is the same as the direction in which the electric current that has gone in from the interlayer connecting part 6 flows.

The minimum width W51 and the maximum width W52 (>W51) of the electric wiring part 5, and the width W6 of the interlayer connecting part 6 show widths in the direction orthogonal to the center line CL3.

The semiconductor element 4a has, similarly to the semiconductor element 4b, such a shape as is shown in FIG. 4(d).

Of course, the shapes of the semiconductor elements 4a and 4b are square in the present embodiment, but may be, for example, oblong.

The two dot-dash-lines show center lines of the semiconductor element 4a, and pass the center point CP1 of the semiconductor element 4a.

Here, the dotted line shows a virtual line which shows the shape of the electric wiring part 5.

The width W4 of the semiconductor element 4a shows a width in the direction orthogonal to the center lines CL1-CL3.

The first lead frame 1, the second lead frame 2, the electric wiring part 5 and the interlayer connecting part 6, and the semiconductor elements 4a and 4b after assembling are in such a position relationship as is shown in FIG. 4(e).

Permitting a tolerance within a distance of roughly 50% of the width W4, the center lines and the center points like the above-mentioned are all disposed on the same line.

Because of that, since the direction of the electric current which flows in the inner part of the first lead frame 1, the electric wiring part 5 and the interlayer connecting part 6, and the semiconductor elements 4a and 4b is opposed to the direction of the electric current which flows in the inner part of the second lead frame 2, an inductance component the first lead frame 1 possesses and an inductance component the second lead frame 2 possesses cancel out by mutual inductance.

Next, while mainly referring to FIGS. 3(a) and (b), further specific descriptions are given regarding the shapes of the electric wiring part 5 and the interlayer connecting part 6.

To begin with, descriptions are given regarding the shape of the electric wiring part 5.

Namely, in order to make inductance components cancel out by mutual inductance as is mentioned above, desirable is a configuration such that the distance H1 between the upper face of the semiconductor element 4a and the upper face of the second lead frame 2, and the distance (the maximum distance) H2 between the upper face of the electric wiring part 5 and the upper face of the second lead frame 2 are equal to or more than 50 µm and are equal to or less than 500 µm.

However, the distance H1 cannot be allowed to be smaller than the distance for which the thickness of the first lead frame 1 and the thickness of the semiconductor element 4a are added.

And, the distance H2 not only cannot be allowed to be smaller than the distance for which the thickness of the first lead frame 1 and the thickness of the semiconductor element 4a are added, but a distance equal to or more than the thickness of the semiconductor element 4a has to be further added in order to ensure the resistance electric voltage.

Hence, it is difficult to realize the above-stated configuration.

Thereupon, utilized is a configuration such that the electric wiring part 5 is a shape of a flat plate being bent, and that the width W1 of the main body parts 1bx and 1cx, and the width W52 of the portions 5a and 5b which are electrically connected with the main body parts 1bx and 1cx are substantially equal.

Hereupon, since the area for generating mutual inductance augments, in the electric wiring part 5 inductance components can be made to cancel out by mutual inductance.

Next, descriptions are given regarding the shape of the interlayer connecting part 6.

Namely, in order to make inductance components cancel out by mutual inductance as is mentioned above, desirable is a configuration such that the distance (the maximum distance) between the upper face of the interlayer connecting part 6 and the upper face of the second lead frame 2 is equal to or more than 50 µm and are equal to or less than 500 µm.

However, since the thickness of the first lead frame 1 and the thickness of the second insulation resin 8 exist, it is difficult to realize the above-stated configuration all the same.

Thereupon, utilized is a configuration such that the interlayer connecting part 6 is a shape of a flat plate being bent, and that the width W1 of the first island-shaped part 1a, and the width W6 of the portion of the interlayer connecting part 6, which is electrically connected with the first island-shaped part 1a, are substantially equal.

Hereupon, since the area for generating mutual inductance augments, also in the interlayer connecting part 6 inductance components can be made to cancel out by mutual inductance.

Next, specific descriptions are given regarding the materials and the like of configuration pieces of the semiconductor apparatus of the present embodiment.

The first lead frame 1 and the second lead frame 2 are configured with Cu, Al, an alloy or the like whose main constituent is any of these. Of course, part or all of the surfaces of the first lead frame 1 and the second lead frame 2 may be treated with Ag, Sn, SnBi or the like.

The heat radiating plate 3 is configured with Cu, Al, an alloy or the like whose main constituent is any of these.

The semiconductor elements 4a and 4b are configured with Si, SiC, GaN, GaAs or the like, and are for example transistors or diodes.

The electric wiring part 5 and the interlayer connecting part 6 are configured with Cu, Al, an alloy or the like whose main constituent is any of these.

The first insulation resin 7 and the second insulation resin 8 are, for example, configured with a publicly known material such that an inorganic component such as silica, AlN, $Al_2O_3$, BN or the like is mixed with a resin component such as an epoxy, a silicone, a polyimide or the like. It is desirable that the heat conduction rates of the first insulation resin 7 and the second insulation resin 8 be equal to or more than 2 W/mK. The reason thereof is that, since the heat which is generated from the semiconductor elements 4a and 4b goes through the insulation resins of two layers of the first insulation resin 7 and the second insulation resin 8, in case the heat conduction rates of these are less than 2 W/mK, then it becomes difficult to allow the heat which is generated from the semiconductor elements 4a and 4b to be sufficiently conducted to the heat radiating plate 3.

The sealing resin 9 is, for example, configured with a publicly known material such that an inorganic component is mixed with a resin component such as an epoxy, a silicone, a polyimide or the like which becomes the main constituent.

The controlling electrode wiring part 14 is configured with Au, Al, Cu or the like, and is for example a member which has been formed by bending a material piece shaped like a line.

Next, while mainly referring to FIGS. 2(a)-(f), specific descriptions are given regarding a manufacturing method of the semiconductor apparatus of the present embodiment.

(First Step)

As shown in FIG. 2(a), the second insulation resin 8 which has been processed so as to be a desired shape is laminated onto the second lead frame 2.

(Second Step)

As shown in FIG. 2(b), the first lead frame 1 which has been prepared is disposed on the upper part of the object completed in the above-stated first step.

And, the temperature and pressure is applied utilizing a press apparatus, and after that the second insulation resin 8 is allowed to harden utilizing a constant temperature bath or the like.

(Third Step)

As shown in FIG. 2(c), the semiconductor elements 4a and 4b which have been prepared are disposed on the upper part of the object completed in the above-stated second step.

Between the semiconductor elements 4a and 4b and the first lead frame 1, for example, bonding materials (not shown in the figures) which are (1) a metal material whose main constituent is any of Sn, Zn, Ag, Au and the like, and (2) a resin material whose main constituent is any of an epoxy, a silicone and the like are utilized.

(Fourth Step)

As shown in FIG. 2(d), the electric wiring part 5 and the interlayer connecting part 6 which have been prepared are disposed on the upper part of the object completed in the above-stated third step.

Regarding the bonding of the semiconductor elements 4a and 4b and the first lead frame 1, and the electric wiring part 5, it would be performed utilizing a clip such that a material shaped like a plate is bent, a wire such that a material shaped like a line is bent or a ribbon such that a material shaped like a ribbon is bent.

Bonding like that (1) would be performed, in a case where a clip is utilized, by solder bonding or adhesion by an electrically conductive resin material but may be performed by welding, ultrasonic bonding, metal diffusion bonding or the like, and (2) would be performed, in a case where a wire or a ribbon is utilized, by ultrasonic bonding but may be performed by welding, metal diffusion bonding, solder bonding, adhesion by an electrically conductive resin material, or the like.

Also regarding the bonding of the first lead frame 1 and the second lead frame 2, and the interlayer connecting part 6, it would be performed similarly to the above-stated bonding.

(Fifth Step)

As shown in FIG. 2(e), the heat radiating plate 3 onto which the first insulation resin 7 has been laminated beforehand is disposed on the lower part of the object completed in the above-stated fourth step.

The present step is performed within the metal mold for sealing which is used in the next sixth step.

(Sixth Step)

As shown in FIG. 2(f), the object completed in the above-stated fifth step is sealed with the sealing resin 9 by a publicly known transfer molding method.

And, the heat radiating plate 3 onto which the first insulation resin 7 has been laminated is fixed to a predetermined position, and after that the first insulation resin 7 and the sealing resin 9 are allowed to harden utilizing a constant temperature bath or the like.

Of course, the above-stated manufacturing method is a specific example.

Embodiment 2

Figure 6:
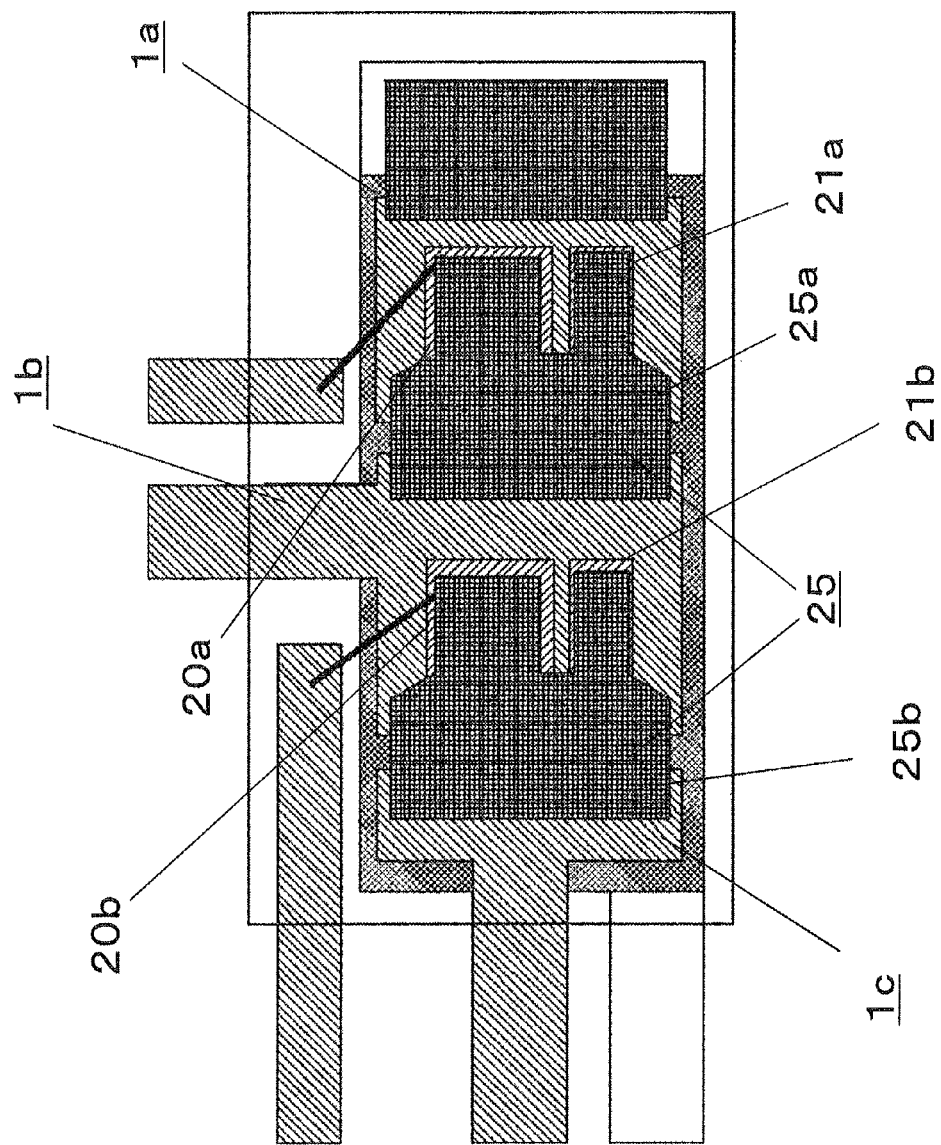
FIG. 6 is a schematic top view of the semiconductor apparatus of Embodiment 2 in the present invention.

Next, while referring mainly to FIG. 6, descriptions are given regarding the configuration and action of the semiconductor apparatus of Embodiment 2.

Additionally, FIG. 6 is a schematic top view of the semiconductor apparatus of Embodiment 2 in the present invention.

The configuration and action of the semiconductor apparatus of the present embodiment is analogous to the configuration and action of the semiconductor apparatus of the above-mentioned Embodiment 1.

Nevertheless, the semiconductor apparatus of Embodiment 1 has been equipped with the two semiconductor elements 4a and 4b, but the semiconductor apparatus of the present embodiment is equipped with the four semiconductor elements 20a, 20b, 21a and 21b.

The semiconductor elements 20a and 20b are configured with Si, SiC, GaN, GaAs or the like, and are for example transistors.

The semiconductor elements 21a and 21b are configured with Si, SiC, GaN, GaAs or the like and are, for example, diodes which are connected in reverse-parallel with the semiconductor elements 20a and 20b respectively that are transistors.

The electric wiring part 25 has the portions 25a and 25b. The portion 25a electrically connects the semiconductor elements 20a and 21a and the second island-shaped part 1b. The portion 25b electrically connects the semiconductor elements 20b and 21b and the third island-shaped part 1c.

The portion 25a is bifurcated so that the portions are formed respectively which are bonded to the semiconductor elements 20a and 21a, and the portion 25b is bifurcated so that the portions are formed respectively which are bonded to the semiconductor elements 20b and 21b.

Since the portions 25a and 25b are bifurcated like this, deviation of the electric current density reduces, and inductance components can be effectively made to cancel out by mutual inductance.

Since the semiconductor apparatuses of the above-mentioned Embodiments 1 and 2 sufficiently lower unnecessary inductance components and thereby allow surge electric voltage which is generated at the time of switching to lower, a semiconductor element whose voltage rating is low can be made use of, and a small-sized and inexpensive semiconductor apparatus is capable of being configured.

Further, the above-stated semiconductor apparatus can also lower noise which is apt to lead to malfunction of an external instrument, and can allow the performance of an inverter or the like which utilizes SiC, GaN, GaAs or the like and has high speed switching performance to be sufficiently exerted.

Additionally, the first insulation resin 7 may be surface coating of the second lead frame 2, the second insulation resin 8 may be surface coating of the first lead frame 1 and/or the second lead frame 2, and the first lead frame 1, the second lead frame 2, the first insulation resin 7 and the second insulation resin 8 may be integrated.

INDUSTRIAL APPLICABILITY

A semiconductor apparatus in the present invention is capable of more lowering unnecessary inductance components, and is useful for the object of being utilized for a semiconductor apparatus which is utilized for an electric power converting apparatus such as an inverter or the like.

DESCRIPTION OF THE REFERENCE NUMERALS 1 first lead frame
2 second lead frame
3 heat radiating plate
4a, 4b semiconductor element
5 electric wiring part
6 interlayer connecting part
7 first insulation resin
8 second insulation resin
9 sealing resin
10 positive-electrode side outer part electrode
11 negative-electrode side outer part electrode
12 output electrode
13a positive-electrode side controlling electrode
13b negative-electrode side controlling electrode
14 controlling electrode wiring part

The invention claimed is:

1. A semiconductor apparatus comprising:
a first lead frame which is equipped with first and second semiconductor elements;
a second lead frame which is disposed in parallel with the first lead frame;
a second insulation resin which is disposed between the first lead frame and the second lead frame;
a sealing resin which seals the first and second semiconductor elements, the first lead frame and the second lead frame;
an electric wiring part which electrically connects the first lead frame with the first and second semiconductor elements;
an interlayer connecting part which electrically connects the first lead frame and the second lead frame;
a heat radiating plate which is disposed in parallel with the second lead frame; and
a first insulation resin which is disposed between the second lead frame and the heat radiating plate, wherein
the sealing resin seals the heat radiating plate,
the first lead frame has: a first island-shaped part which is equipped with the first semiconductor element; a second island-shaped part which has an output electrode, and is equipped with the second semiconductor element; and a third island-shaped part which has one of a positive-electrode side outer part electrode and a negative-electrode side outer part electrode,
the second lead frame has another of the positive-electrode side outer part electrode and the negative-electrode side outer part electrode,
the electric wiring part electrically connects the first semiconductor element and the second island-shaped part, and electrically connects the second semiconductor element and the third island-shaped part, and
the interlayer connecting part electrically connects the first island-shaped part and the second lead frame.

2. The semiconductor apparatus according to claim 1, wherein
a distance between the first lead frame and the second lead frame is equal to or more than 50 μm and equal to or less than 500 μm.

3. The semiconductor apparatus according to claim 1, wherein
the first island-shaped part has a shape of a rectangle,
a main body part of the second island-shaped part, except for the output electrode, has a shape of a rectangle,
a main body part of the third island-shaped part, except for the one of the positive-electrode side outer part electrode and the negative-electrode side outer part electrode, has a shape of a rectangle,
a main body part of the second lead frame, except for the another of the positive-electrode side outer part electrode and the negative-electrode side outer part electrode, has a shape of a rectangle,
a center line of the first island-shaped part, a center line of the main body part of the second island-shaped part, a center line of the main body part of the third island-shaped part, a center line of the main body part of the second lead frame, a center line of the electric wiring part and a center line of the interlayer connecting part are disposed on a same line, and
center points of the first and second semiconductor elements are disposed on the same line.

4. The semiconductor apparatus according to claim 1, wherein
the electric wiring part has a shape of a flat plate being bent,
a main body part of the second island-shaped part, except for the output electrode, has a shape of a rectangle,
a main body part of the third island-shaped part, except for the one of the positive-electrode side outer part electrode and the negative-electrode side outer part electrode, has a shape of a rectangle, and
equal are a width of the main body part of the second island-shaped part in a direction orthogonal to an electric current direction, a width of the main body part of the third island-shaped part in a direction orthogonal to an electric current direction, and a width of a portion of the electric wiring part, which is electrically connected with the second and third island-shaped parts, in a direction orthogonal to an electric current direction.

5. The semiconductor apparatus according to claim 1, wherein
the interlayer connecting part has a shape of a flat plate being bent,
the first island-shaped part has a shape of a rectangle, and
equal are a width of the first island-shaped part in a direction orthogonal to an electric current direction, and a width of a portion of the interlayer connecting part, which is electrically connected with the first island-shaped part, in a direction orthogonal to an electric current direction.

6. The semiconductor apparatus according to claim 1, being a semiconductor apparatus which is utilized for an electric power converting apparatus for a 3-phase motor, wherein
the output electrode is an electrode which is connected to one of U phase, V phase and W phase electrodes of the 3-phase motor.

* * * * *